United States Patent [19]

Sakamoto

[11] 4,031,491
[45] June 21, 1977

[54] TUNING APPARATUS USING A VOLTAGE-DEPENDENT REACTANCE ELEMENT

[75] Inventor: Yoichi Sakamoto, Takatsuki, Japan

[73] Assignee: Matsushita Electric Industrial Co., Ltd., Kadoma, Japan

[22] Filed: Feb. 20, 1975

[21] Appl. No.: 551,383

[30] Foreign Application Priority Data

Feb. 25, 1974 Japan .............................. 49-22636
Feb. 25, 1974 Japan .............................. 49-22637
Mar. 4, 1974 Japan .............................. 49-25448

[52] U.S. Cl. .................. 334/15; 325/452; 325/458; 325/465; 334/11; 334/16
[51] Int. Cl.² ............. H03H 5/12; H03J 3/06; H03J 5/04
[58] Field of Search .............. 334/14, 15, 16, 11, 334/55; 325/452, 458, 465

[56] References Cited

UNITED STATES PATENTS

| | | | |
|---|---|---|---|
| 3,117,293 | 1/1964 | Mortley | 334/15 |
| 3,495,195 | 2/1970 | Ribour | 334/15 |
| 3,588,706 | 6/1971 | Sakai et al. | 325/452 |
| 3,614,666 | 10/1971 | Ribour et al. | 334/15 |
| 3,641,463 | 2/1972 | Perks | 334/15 |
| 3,651,411 | 3/1972 | Zlotnick | 334/15 |
| 3,657,654 | 4/1972 | Friberg | 325/452 |
| 3,679,990 | 7/1972 | Hiday et al. | 334/15 |
| 3,748,645 | 7/1973 | Kawashima | 325/465 |
| 3,846,707 | 11/1974 | Sakamoto et al. | 334/15 |
| 3,868,609 | 2/1975 | Koyangi | 334/15 |
| 3,882,400 | 5/1975 | Hamada | 325/465 |
| 3,895,303 | 7/1975 | Imazeki et al. | 325/465 |

*Primary Examiner*—Saxfield Chatmon, Jr.
*Attorney, Agent, or Firm*—Stevens, Davis, Miller & Mosher

[57] ABSTRACT

A tuning apparatus using a voltage-dependent reactance element comprising a tuning circuit including a voltage-dependent reactance element as a tuning element, a voltage sweep circuit for generating a sweep tuning voltage to be applied to the voltage-dependent reactance element, an operational circuit for converting the tuning voltage to a reference voltage which linearly varies in proportion with a tuning frequency and a voltage comparator circuit for comparing an output of the operational circuit with a predetermined standard voltage, an output of the voltage comparator circuit being used to control the sweep of the voltage sweep circuit to produce a predetermined tuning frequency.

9 Claims, 8 Drawing Figures

TUNING APPARATUS USING A VOLTAGE-DEPENDENT REACTANCE ELEMENT

The present invention relates to a tuning apparatus using a voltage-dependent or variable reactance element such as a varactor diode or the like as a tuning frequency varying element in a tuning circuit.

In a tuning apparatus using a voltage dependent capacitance diode as a tuning element, there are, in general, two types of means for applying a predetermined magnitude of tuning voltage to the voltage-dependent capacitance diode. In the first type, a sweep voltage the magnitude of which linearly varies with time is applied to the voltage-dependent capacitance diode to vary the tuning frequency, and the sweep of the voltage is ceased when a magnitude of tuning voltage which corresponds to the frequency of broadcasting signal is reached, and the voltage (frequency) at that moment is maintained. In the second type, a plurality of tuning voltages are preset by a plurality of variable resistors and any desired one of them is selected by a switch for the application to the voltage-dependent capacitance diode.

Since the tuning frequency of the tuning circuit using the voltage-dependent capacitance diode is not in linear proportion relation with the tuning voltage but in logarithmic relation as described later, the rate of change in the tuning frequency with respect to the change in the tuning voltage at the beginning of the sweep differs from that at the end of the sweep. For this reason, in the first type, when the magnitude of the tuning voltage is to be selected by other means, a voltage used as a standard for the selection also requires a logarithmic characteristic. As a result, a special standard voltage generator means is required. In addition, when the tuning voltage is to be applied to a voltmeter to indicate the tuning frequency by the reading of the meter, there occurs a drawback that the spacing of the scale at a higher frequency range differs from that at a lower frequency range. Furthermore, in the second type, when an AFC is to be operated, the AFC sensitivity at a higher frequency range differs from that at a lower frequency range so that tuning to an accurate frequency may not be attained.

It is, therefore, a primary object of the present invention to provide a tuning apparatus using a variable reactance element which is capable of controlling the tuning frequency using a standard voltage the magnitude of which is linearly proportional to the tuning frequency.

It is another object of the present invention to provide an apparatus which permits the equi-spacing indication of the tuning frequency by an indicator such as voltmeter or the like.

It is a further object of the present invention to provide a tuning apparatus using a variable reactance element which is capable of being accurately tuned to a received signal either at a higher frequency region or a lower frequency region within the tuning frequency range.

Those and other objects of the present invention can be accomplished by the present invention which is characterized by the provision of a tuning circuit including a voltage-dependent reactance element as a tuning element, a voltage sweep circuit for sweeping a D.C. tuning voltage to be applied to the voltage-dependent reactance element, an operational circuit for converting the tuning voltage to a D.C. reference voltage which linearly varies with the tuning frequency, a voltage comparator circuit for comparing an output of the operational circuit with a standard D.C. voltage and means in response to an output from the voltage comparator circuit for controlling the sweep of the voltage sweep circuit to generate a predetermined D.C. tuning voltage.

The above and other objects, features and advantages of the invention will become more apparent from the following detailed description of the preferred embodiments of the invention when taken in conjunction with the accompanying drawings, in which.

Figure 1:
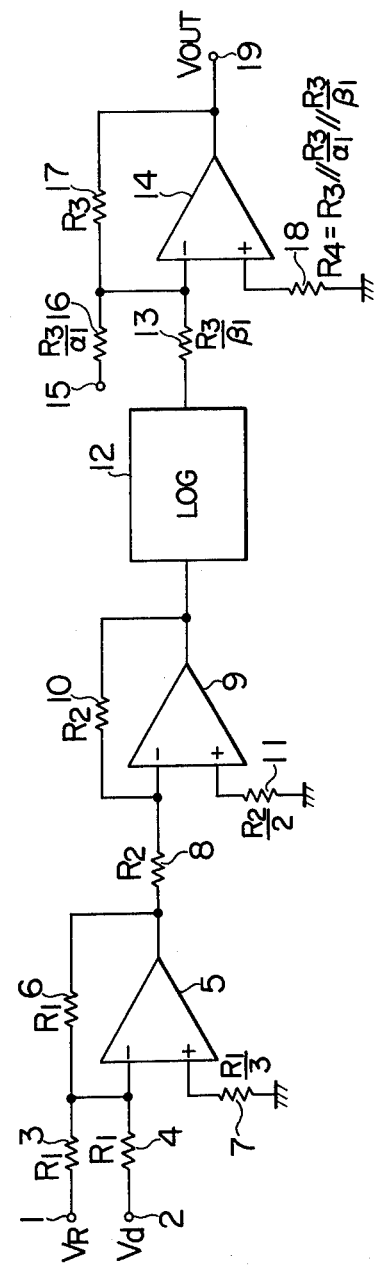
FIG. 1 shows an example of a circuit which produces an output linearly varying with a tuning frequency of a variable capacitance diode tuner, which is used in the present apparatus.

The capacitance C of a variable capacitance diode is represented by;

$$C = K \cdot (V_R + V_d)^{-1/n} \qquad (1)$$

where $V_d$ is a contact potential difference and $V_R$ is a reverse applied voltage. A tuning frequency $f$ for a tuning circuit using such a variable capacitance diode is a function of $C$ and may be represented by;

$$f = \frac{1}{2\pi \sqrt{L(C + C_o)}} \qquad (2)$$

where $L$ is a tuning inductance and $C_o$ is a distributed capacitance. Assuming that $C$ is sufficiently larger than $C_o$, the logarithm of $f$ is derived from the equation (2);

$$\log f = \log \frac{1}{2\pi \sqrt{L}} - \frac{1}{2} \log C \qquad (3)$$

The logarithm of $C$ is derived from the equation (1);

$$\log C = \log K - \frac{1}{n} \log (V_R + V_d) \qquad (4)$$

By using the equation (4) in the equation (3);

$$\log f = \log \frac{1}{2\pi \sqrt{L}} - \frac{1}{2} \log K + \frac{1}{2n} \log (V_R + V_d) \qquad (5)$$

when the range of $f$ is sufficiently small, the following expression may be applied;

$$\frac{d}{df} \log f = \frac{1}{f} = A \qquad (6)$$

where A is a constant. Thus $$\log f = Af + B \tag{7}$$

where B is a constant. Accordingly, from the equations (5) and (7), it follows that;

$$Af + B = \log \frac{1}{2\pi \sqrt{L}} - \frac{1}{2} \log K + \frac{1}{2n} \log (V_R + Vd)$$

Thus, $$f = \frac{1}{A} \left( \log \frac{1}{2\pi \sqrt{L}} - \frac{1}{2} \log K - B + \frac{1}{2n} \log (V_R + Vd) \right)$$

$$= \alpha + \beta \log (V_R + Vd) \tag{8}$$

where $\alpha$ and $\beta$ are constants and $$\left. \begin{array}{l} \alpha = \frac{1}{A} \left( \log \frac{1}{2\pi \sqrt{L}} - \frac{1}{2} \log K - B \right) \\ \beta = \frac{1}{2An} \end{array} \right\} \tag{9}$$

By making use of the above-described relationship, it is possible to produce a reference voltage output $Vout$ which linearly varies with the tuning frequency or a local oscillation frequency $f$ of the tuner having the tuning circuit including the variable capacitance diode as a tuning element. An example of such an operational circuit is shown in FIG. 1. By the circuit, the reference voltage output $Vout$ is produced as a linear function of the tuning voltage to be applied to an input of the circuit, that is, the variable capacitance diode.

Referring to FIG. 1, 1 designates an input terminal for the tuning voltage $V_R$ and 2 designates an input terminal for a voltage $Vd$ the magnitude of which corresponds to the contact potential difference. Both input terminals 1 and 2 are coupled through resistors 3 and 4 to an operational amplifier 5 where they are added together. Resistors 6 and 7 are also coupled thereto. An output of the operational amplifier 5 is coupled through a resistor 8 to an operational amplifier 9 to which resistors 10 and 11 are connected and in which it is amplified. The operational amplifier 9 is set such that the output thereof is $V_R + Vd$. This output is applied to a logarithm converter circuit 12 where it is logarithmically converted to produce an output of log ($V_R + Vd$). The output is applied through a resistor 13 to an operational amplifier 14. From an input terminal 15 a voltage the magnitude of which corresponds to a unit voltage is applied, which is then applied through a resistor 16 to the operational amplifier 14 to which resistors 17 and 18 are connected and in which both input voltages are added together with the ratio $\alpha/\beta$ so that a reference voltage output $Vout$ the magnitude of which is proportional to $\alpha + \beta \log (V_R + V_d)$, that is, linearly proportional to the tuning frequency, is produced at an output terminal 19. The $\alpha_1$ and $\beta_1$ shown in FIG. 1 represent constants which are proportional to $\alpha$ and $\beta$ of the equation (9) above, respectively and the $R_1$, $R_2$ and $R_3$ represent resistors.

Figure 2:
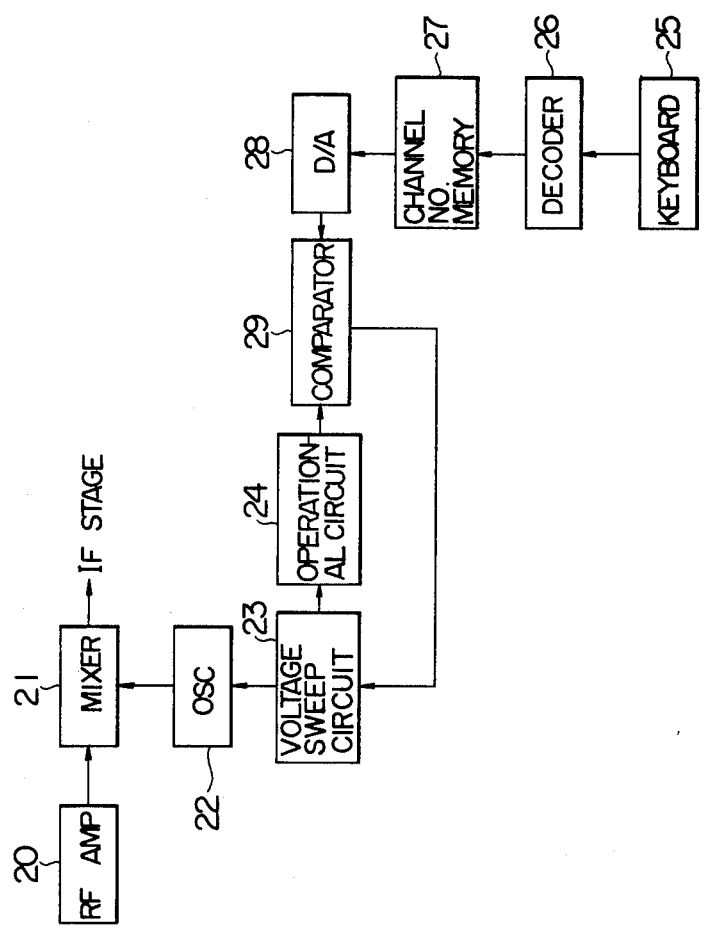
FIG. 2 is a block diagram showing an embodiment of the present invention.
Figure 3:
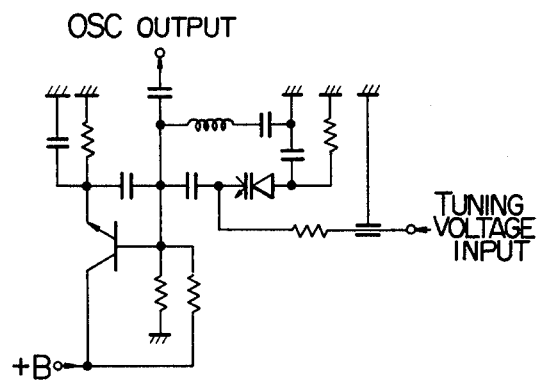
FIG. 3 is a wiring diagram illustrating an example of a local oscillator shown in FIG. 2.
Figure 4:
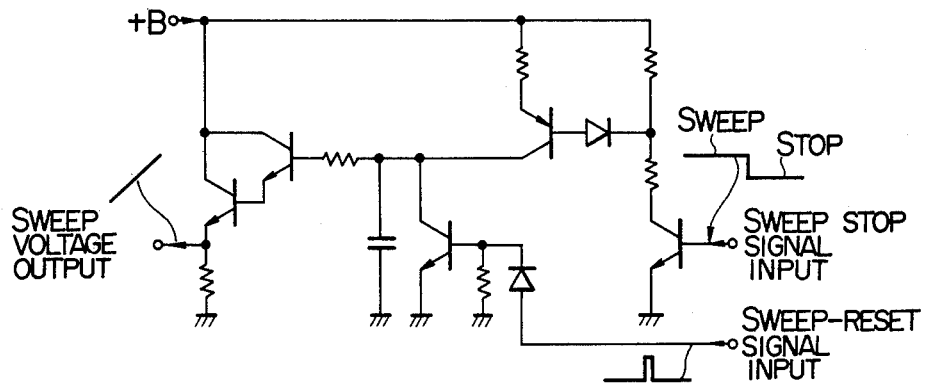
FIG. 4 is a wiring diagram illustrating an example of a voltage sweep circuit shown in FIG. 2.
Figure 5:
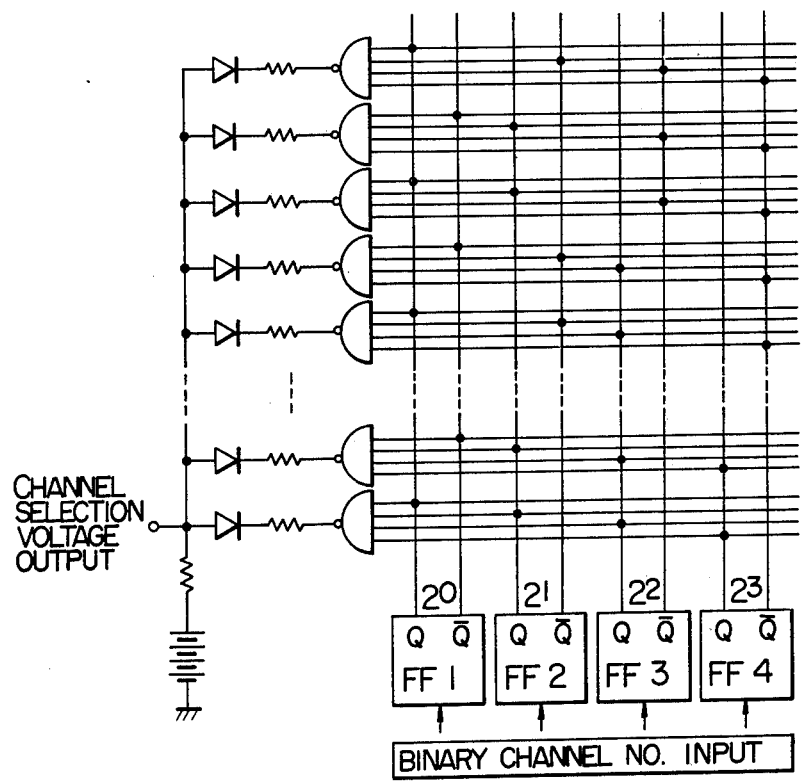
FIG. 5 is a wiring diagram illustrating a portion of a control section shown in FIG. 2.
Figure 6:
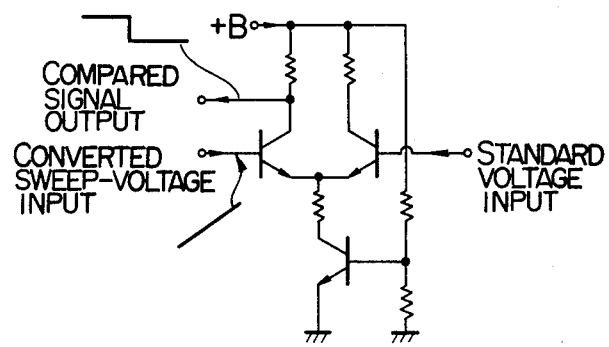
FIG. 6 is a wiring diagram illustrating an example of a voltage comparator shown in FIG. 2.

The present invention is characterized by the control of the tuning frequency using the above-mentioned operational circuit. FIG. 2 shows an embodiment of the present invention applied in a channel selection circuit. In FIG. 2, 20 designates a high frequency amplifier, 21 a mixer and 22 a local oscillator by all of which a tuner including a variable capacitance diode as a tuning element is constructed. The local oscillator may be constructed as shown in FIG. 3. 23 designates a voltage sweep circuit the tuning voltage output $V_R$ of which is applied to the variable capacitance diode of the local oscillator 22 and also applied to an operational circuit 24 as shown in FIG. 1. The voltage sweep circuit 23 may be constructed, for example, as shown in FIG. 4. As stated above, the output of the operational amplifier 24 produces a reference voltage which is in linear proportional relationship with the local oscillation frequency which logarithmically corresponds to the sweep voltage or the tuning voltage. When a desired channel to be received is specified by means for specifying the channel-number or the frequency of the desired channel, such as by a keyboard 25, the output thereof is applied through a decoder 26 to a channel number memory circuit 27 and stored therein. The output is further converted to analog form by a digital-to-analog converter 28 so that a standard voltage corresponding to the channel number, that is, a voltage linearly proportional to the desired frequency to be received is produced from the digital-to-analog converter 28. The memory circuit 27 and the digital-to-analog converter circuit 28 may be constructed, for example, as shown in FIG. 5. The output of the operational circuit 24 and the output of the digital-to-analog converter 28 are applied to a voltage comparator 29 which is swept by the voltage sweep circuit 23. When the reference voltage output of the operational circuit 24 becomes equal to the standard voltage output of the digital-to-analog converter 28, the voltage comparator 29 produces a voltage sweep stop control signal to cause the sweep of the voltage sweep circuit 23 to cease for rendering the voltage sweep circuit 23 to tune to the frequency at the instant of the cease of the sweep. The voltage comparator 29 may be constructed, for example, as shown in FIG. 6.

With the arrangement of the present invention thus constructed, since the reference voltage is linearly proportional to the tuning frequency, it is possible to render the digital-to-analog converter 28 to develop the reference voltage which is linearly proportional to the desired frequency to be received. Thus, with a conventional digital-to-analog converter and the like of simple construction it is possible to accurately tune to a given frequency whereby the circuit may be rendered simpler in construction and cheaper.

Figure 7:
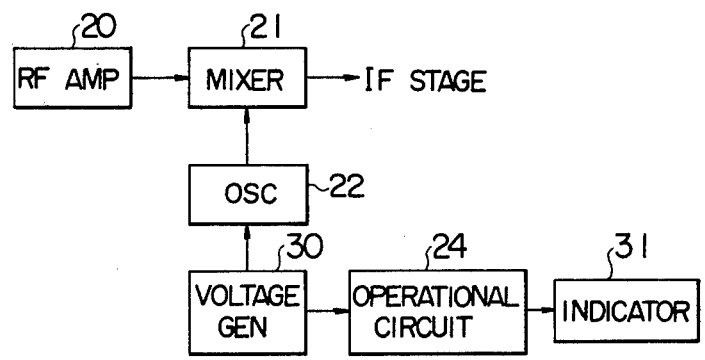
FIG. 7 is a block diagram showing another embodiment of the present invention.

FIG. 7 shows another embodiment of the present invention. In the figure, 20 designates a high frequency amplifier, 21 a mixer circuit and 22 a local oscillator, all of which are similar to those shown in FIGS. 2 to 3 and by which a tuner including a variable capacitance diode as a tuning element is constructed. 30 designates a tuning voltage generator circuit for applying a necessary tuning voltage to the variable capacitance diode of the tuner. It produces a plurality of tuning voltages of different magnitude which is preset by a plurality of potentiometer, or it produces a continuously varying tuning voltage by the voltage sweep circuit as shown in FIG. 4. The tuning frequency is in the relation given by the equation (8) above with respect to the tuning voltage. A portion of the output from the tuning voltage generator circuit 30 is applied to the input of the operational circuit 24 as described in connection with FIG. 1 and the output of the operational circuit 24 is applied to a voltmeter or a channel indicator 31 of a television receiver. The output of the operational circuit 24 have the above-mentioned conversion applied to the tuning voltage of the tuning voltage generator circuit 30 so that it produces a reference voltage linearly proportional to the tuning frequency or the local oscillation frequency of the tuner. As a result the indicator 31 can give the indication which is substantially linearly proportional to the tuning frequency.

As described above, according to the present apparatus, since the relationship between the tuning frequency and the indicated voltage or the reference voltage is substantially linearly proportional, the indicator can indicate the tuning frequency with an equi-spacing scale. Thus easy reading of the indicator is assured.

Figure 8:
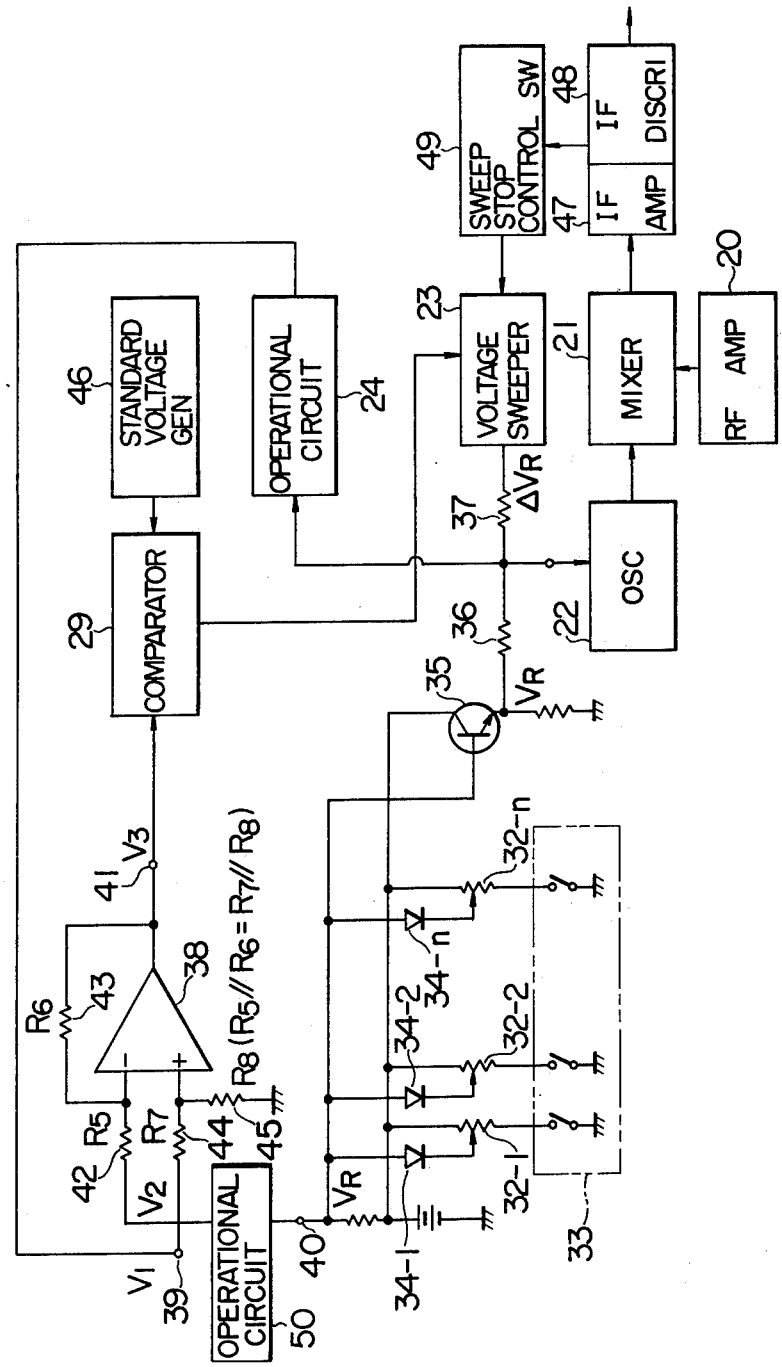
FIG. 8 is a wiring diagram showing a further embodiment of the present invention.

FIG. 8 shows a further embodiment of the present invention. In this embodiment, the sweep band for the tuning frequency is limited to a narrow band width near a desired frequency to be received and the sweep is repetitively effected within this band width even in the absence of the received signal so that even if detuning occurs by a temporary interruption of a broadcasting signal the automatic retune to the receiving frequency may be assured when the broadcasting signal is again received. In addition, the sweep band width can be maintained at a constant value irrespective of the magnitude of the tuning frequency.

In FIG. 8, 32-1 to 32-n represent potentiometers.

One of the tuning voltages of approximate magnitude preset by the potentiometers is selected by a switching circuit 33 and applied to a base of a transistor 35 through diodes 34-1 to 34-n. It is then taken out of an emitter of the transistor and superimposed on the output tuning voltage of the voltage sweep circuit 23 of the circuit as shown in FIG. 4 by means of resistors 36 and 37. The resulting voltage is applied to the variable capacitance diode of the local oscillator 22 of the tuner. It is also applied to the input terminal 1 of the operational circuit 24 described in connection with FIG. 1 to produce at an output thereof the reference voltage $V_1$ which is proportional to the tuning frequency or the local oscillation frequency of the tuner. This reference voltage is applied to one input terminal 39 of an operational amplifier 38 which constitutes a subtraction circuit.

Furthermore, an output voltage $V_R$ from the terminal 40 in FIG. 8 is operated in an operational circuit 50 having the same construction as the operational circuit 24 to be applied to the subtraction circuit 38 as other input voltage $V_2$. From the equation (8) there is a following relation between said voltage $V_2$ and the tuning frequency $f_2$ resulting from the application of the output voltage $V_R$ to the variable capacitance diodes:

$$V_2 \alpha f_2 = \alpha + \beta \log (V_R + Vd) \qquad (10)$$

On the other hand, there is a following relation between the tuning frequency $f_1$ ($=f_2 = \Delta f$, where $\Delta f$ is the adding frequency produced by the voltage sweep circuit 23) corresponding to the voltage $V_1$, and the output voltage $\Delta V_R$ of the voltage sweep circuit 23 at that moment;

$$V_1 \alpha f_1 = \alpha + \beta \log (V_R + \Delta V_R + Vd) \qquad (11)$$

Through the operation by the subtraction circuit 38, a voltage $$V_3 = \frac{R_6}{R_5} (V_1 - V_2) \alpha (f_1 - f_2) = \Delta f$$

is produced at an output thereof, which output is then compared with the constant output voltage from the standard voltage generator 46 at the comparator 29 for controlling the voltage sweep circuit 23. The operational amplifier 38 is connected with resistors 43 to 45. Since the reference voltages $V_1$ and $V_2$ vary linearly with respect to the tuning frequency as stated in connection with FIG. 1, the reference voltage $V_3$ is proportional to only the adding frequency due to the sweep voltage applied by the voltage sweep circuit 23 and it is independent of the tuning frequency resulting from the application of one of the preset voltages at the potentiometers that was selected by the switching circuit 33, to the variable capacitance diode. Herein, the adding frequency corresponds to a differential frequency between a tuning frequency at the moment of the application of the voltage selected by the switching circuit 33 to the variable capacitance diode and a tuning frequency at the moment of the application of a superimposed voltage of said selected voltage and the sweep voltage from the voltage sweep circuit 23 to the variable capacitance diode. Thus the adding frequency is determined by the sweep voltage. The reference voltage $V_3$ is then applied to the voltage comparator 29 as shown in FIG. 6 to be compared with the output standard voltage from a standard voltage generator circuit 46. When both voltages are equal a sweep reset control signal is produced by the comparator, which is applied to the voltage sweep circuit 23 to reset the output voltage level of the voltage sweep circuit 23 to zero to render the voltage sweep circuit ready for the restart of the sweep from zero level. Thus, the frequency of the sweep of the voltage sweep circuit 23 is controlled by the output standard voltage of the standard voltage generator circuit 46. Other voltage discriminator circuit such as Schmitt circuits may be used in place of the standard voltage generator circuit 46 and the voltage comparator 29.

An intermediate frequency signal, which is the output from the mixer circuit 21 of the tuner, is amplified by an intermediate frequency amplifier 47 and applied to a frequency discriminator 48. By applying an intermediate frequency signal detection output from the frequency discriminator 48 to a switching control circuit 49 for controlling the stop of the sweep of the voltage sweep circuit 23 and maintaining the voltage at the instant of the stop of the sweep, an automatic tuning circuit may be constructed by a loop including 23, 22, 21, 47, 48 and 49 so that the sweep of the voltage sweep circuit 23 is stopped at a predetermined tuning point.

In the circuit described above, by presetting the voltages to be preset by the potentiometers 32-1 to 32-n to the vicinities of the tuning voltages which are required to tune the tuner to the desired frequencies to be received, and by determining the sweep width of the sweep voltage from the output of the voltage sweep circuit 23 such that it covers the desired frequencies to be received, the automating tuning to the desired frequencies to be received is accomplished. By adjusting the output standard voltage of the standard voltage generator circuit 46 such that the sweep width of the tuning frequency swept by the sweep voltage is rendered narrower, for example in the order of 3 MHz in case of the television broadcasting, than the frequency difference between adjacent channels (including voice carriers in case of the television broadcasting), the sweep will be restarted from the preset frequency even if a temporary detuning occurs due to the interruption of the broadcast, etc. so that the automatic retuning to the receiving frequency upon reception of the broadcasting signal is assured. It is seen from the equation (8) above that in order to maintain a constant sweep width of the tuning frequency both for the channels having higher tuning frequency and the channels having lower tuning frequency, it is necessary to broaden the sweep width of the voltage sweep circuit 23 as the tuning frequency of the channel increases. According to the present invention, since the reference voltage $V_3$ which is linearly proportional to the above-mentioned adding frequency irrespective of the magnitude of the tuning frequency, that is the reference voltage the magnitude of which is always constant so long as the sweep width of the tuning frequency is kept constant, is produced at the output terminal 41 by the cooperation of the operational circuit 24 and the operational amplifier 38, the output standard voltage from the standard voltage generator circuit 46 can be maintained constant. Namely, which ever channel the switching circuit may select, the reference voltage is proportional to the adding frequency (which is determined solely by the magnitude of the sweep voltage from the voltage sweep circuit) added to a basic tuning frequency for the selected channel (which is uniquely determined by a tuning voltage derived through the transistor 35 from the voltage across that one of the potentiometer (32-1) ... (32-n) which is selected by the switching circuit 33). Therefore, the reference voltage is independent from the tuning frequency selected by the switching circuit. The variation of the reference voltage (the extent of change) is identical for every tuning frequency. Accordingly, the standard voltage generator 46 generates only one constant standard voltage and it is not necessary to change the constant standard voltage for each channel. This is also a significant advantage of the present invention. In this manner, the voltage sweep of constant width may always be assured by an extremely simple circuit construction. As described hereinabove, the present invention can provide easier and accurate control of the voltage sweep circuit.

What we claim is:

1. A tuning apparatus comprising:
   a tuning circuit including means for generating tuning frequencies having a voltage dependent reactance element as a tuning element;
   a voltage sweep circuit coupled to said tuning circuit for producing a D.C. sweep tuning voltage, said D.C. sweep tuning voltage being applied to said voltage dependent reactance element to control the generation of said tuning frequencies;
   an operational circuit including a logarithm converter circuit coupled to said voltage sweep circuit for converting said D.C. tuning voltage to a D.C. reference voltage which varies in linear proportion to said tuning frequencies;
   a standard voltage generating circuit for selectively producing a D.C. standard voltage;
   voltage comparator means coupled to said operational circuit for comparing said D.C. reference voltage with said D.C. standard voltage; and
   means coupling said comparator means to said voltage sweep circuit for controlling the sweep of said voltage sweep circuit in response to the output of said comparator means to produce a predetermined tuning frequency in said tuning circuit.

2. A tuning apparatus with a voltage-dependent reactance element according to claim 1 wherein said voltage-dependent reactance element is a voltage-dependent capacitance diode.

3. The tuning apparatus according to claim 1, wherein:
   said D.C. standard voltage is linearly proportional to a desired tuning frequency; and
   said comparator means compares said D.C. reference voltage with said D.C. standard voltage and generates an output signal when said reference and standard voltages are equal, said output signal being applied to said voltage sweep circuit to stop the sweeping of said sweep circuit whereby the tuning voltage output is maintained at a constant value to tune said tuning circuit to said desired tuning frequency.

4. A tuning apparatus with a voltage-dependent reactance element according to claim 1 wherein means is provided to apply said reference voltage to an indicator to indicate the tuning frequency.

5. A tuning apparatus with a voltage-dependent reactance element according to claim 1 further comprising means for presetting a plurality of tuning voltages and means for selecting any desired one of said tuning voltages to superimpose the same on the tuning voltage from said voltage sweep circuit for application to said voltage-dependent reactance element.

6. A tuning apparatus with a voltage-dependent reactance element according to claim 2 wherein the output reference voltage of said operational circuit is proportional to $$\alpha + \beta \log (V_d + V_R)$$

where $\alpha$ and $\beta$ are constants, $V_d$ is the contact potential difference of the voltage-dependent capacitance diode, and $V_R$ is the tuning voltage.

7. A tuning apparatus with a voltage-dependent reactance element according to claim 1 wherein said standard voltage generating circuit includes channel specifying means, a decoder for decoding an input specified by said channel specifying means, a channel number memory circuit for storing an output of said decoder, and a digital-to-analog converter circuit for digital-to-analog converting an output of said channel number memory circuit to produce the standard voltage which is linearly proportional to the tuning frequency.

8. The tuning apparatus according to claim 5, wherein:
   said operational circuit includes means for determining a difference voltage which is the difference between said converted D.C. tuning voltage and a selected one of the preset tuning voltages;
   said standard D.C. voltage is a constant voltage; and
   said comparator means compares said D.C. standard voltage and said difference voltage, said comparator means generating an output signal when said standard and difference voltages are equal to thereby reset the sweep of said sweep circuit to permit a constant width repetitive sweep of the tuning frequency.

9. The tuning circuit according to claim 5, wherein:

said operational circuit includes means for determining the difference between said converted voltage and a selected one of said preset tuning voltages;
said D.C. standard voltage has a constant value such that the frequency bandwidth of the tuning frequency is narrower than the frequency separation between adjacent channels to be tuned; and
said comparator means compares said difference voltage and said standard voltage, said comparator means generating an output signal when said difference and standard voltages are equal to stop the sweep of said voltage sweep circuit when said tuning circuit receives a signal tuned to said desired frequency during the frequency sweep operation; and
said tuning apparatus further comprising means to maintain the tuned voltage at a constant value upon stopping said sweep.

* * * * *